United States Patent
Mortazawi et al.

(10) Patent No.: US 10,020,595 B2
(45) Date of Patent: Jul. 10, 2018

(54) NEGATIVE GROUP DELAY CIRCUIT

(71) Applicant: THE REGENTS OF THE UNIVERSITY OF MICHIGAN, Ann Arbor, MI (US)

(72) Inventors: Amir Mortazawi, Ann Arbor, MI (US); Waleed Alomar, Riyadh (SA)

(73) Assignee: The Regents of the University of Michigan, Ann Arbor, MI (US)

(*) Notice: Subject to any disclaimer, the term of this patent is extended or adjusted under 35 U.S.C. 154(b) by 91 days.

(21) Appl. No.: 14/892,673

(22) PCT Filed: May 21, 2014

(86) PCT No.: PCT/US2014/038983
§ 371 (c)(1),
(2) Date: Nov. 20, 2015

(87) PCT Pub. No.: WO2014/190062
PCT Pub. Date: Nov. 27, 2014

(65) Prior Publication Data
US 2016/0093958 A1      Mar. 31, 2016

Related U.S. Application Data

(60) Provisional application No. 61/825,567, filed on May 21, 2013.

(51) Int. Cl.
*H01Q 21/06* (2006.01)
*H03F 3/24* (2006.01)
(Continued)

(52) U.S. Cl.
CPC .............. *H01Q 21/06* (2013.01); *H01Q 1/50* (2013.01); *H03F 1/56* (2013.01); *H03F 3/19* (2013.01);
(Continued)

(58) Field of Classification Search
CPC .. H01Q 21/06; H01Q 1/50; H03F 1/56; H03F 3/19; H03F 3/24; H03F 3/68; H03F 7/38; H03F 2200/451
(Continued)

(56) References Cited

U.S. PATENT DOCUMENTS

2005/0156779 A1   7/2005   Wixforth
2007/1039117      6/2007   Sachio Lida
(Continued)

FOREIGN PATENT DOCUMENTS

JP      2010098402 A      4/2010

OTHER PUBLICATIONS

Ravelo et al.,"An FET-Based Microwave Active Circuit with Dual-Band Negative Group Delay", Journal of Microwaves, Optoelectronics and Electromagnetic Applications, vol. 10, No. 2, Dec. 2011, pp. 355-366.*

(Continued)

*Primary Examiner* — Benny Lee
*Assistant Examiner* — Hafizur Rahman
(74) *Attorney, Agent, or Firm* — Reising Ethington P.C.

(57) ABSTRACT

A circuit for generating a negative group delay (NGD). The circuit comprises one or more electrical components, at least one of which has an input impedance that is sufficient for the electrical component(s) to generate an NGD. In an embodiment, the circuit comprises antenna that is configured to radiate an electrical signal delivered thereto and generate an NGD. The antenna has an input impedance sufficient for the antenna to generate the NGD. In another embodiment, the circuit comprises an amplifier that is configured to amplify an electrical signal delivered thereto and generate an NGD. In such an instance, the amplifier has an input impedance and either the amplifier or one or more matching circuits thereof has a quality factor sufficient to generate the NGD.

31 Claims, 8 Drawing Sheets

(51) Int. Cl.
| | |
|---|---|
| *H03F 3/68* | (2006.01) |
| *H01Q 1/50* | (2006.01) |
| *H03F 1/56* | (2006.01) |
| *H03F 3/19* | (2006.01) |
| *H03H 7/38* | (2006.01) |

(52) U.S. Cl.
CPC ............... *H03F 3/24* (2013.01); *H03F 3/68* (2013.01); *H03H 7/38* (2013.01); *H03F 2200/451* (2013.01)

(58) Field of Classification Search
USPC ......... 333/32, 100, 138, 140, 141, 150, 164, 333/165, 166, 213, 216, 217; 330/54, 330/107, 280; 343/722, 744, 778, 802, 343/856; 455/67.16, 276.1, 304
See application file for complete search history.

(56) References Cited

U.S. PATENT DOCUMENTS

| | | |
|---|---|---|
| 2011/0227664 A1 | 9/2011 | Wyville |
| 2012/0105296 A1 | 5/2012 | Chung et al. |

OTHER PUBLICATIONS

Keser et al., "Removal of Beam Squint in Series Fed Array Antennas Using Abnormal Group Delay Phase Shifters", 2010 IEEE Antennas and Propagation Society International Symposium, Jul. 11-17, 2010, pp. 1-4.*
International Search Report for application No. PCT/US2014/0038983, dated Oct. 10, 2014, 3 pages.

* cited by examiner

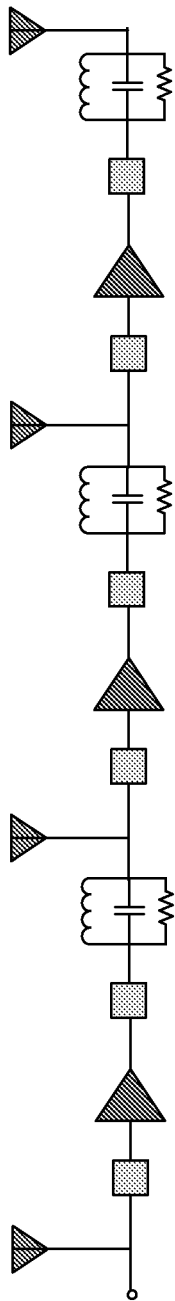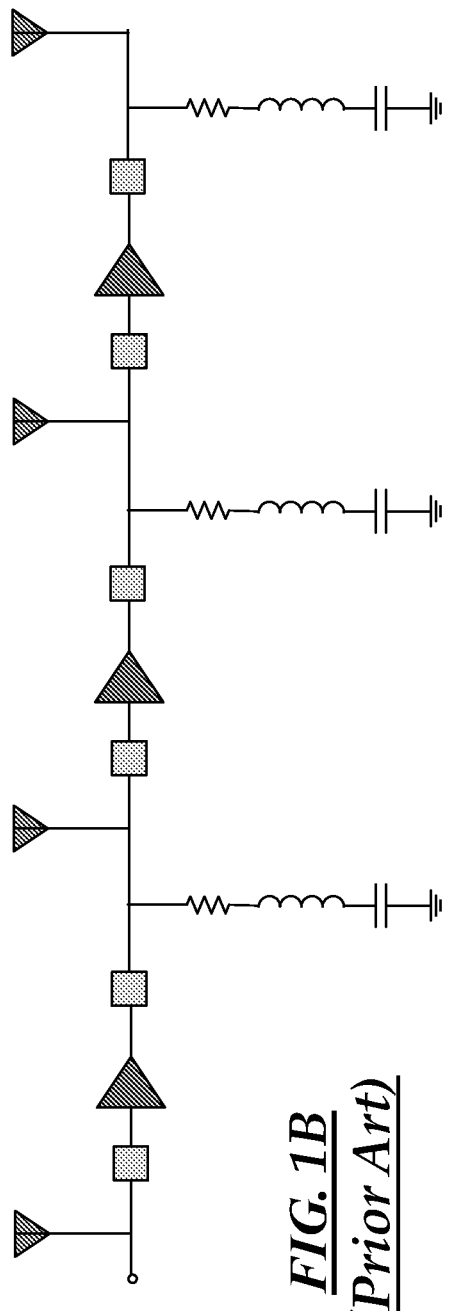
FIG. 1A (Prior Art)
FIG. 1B (Prior Art)

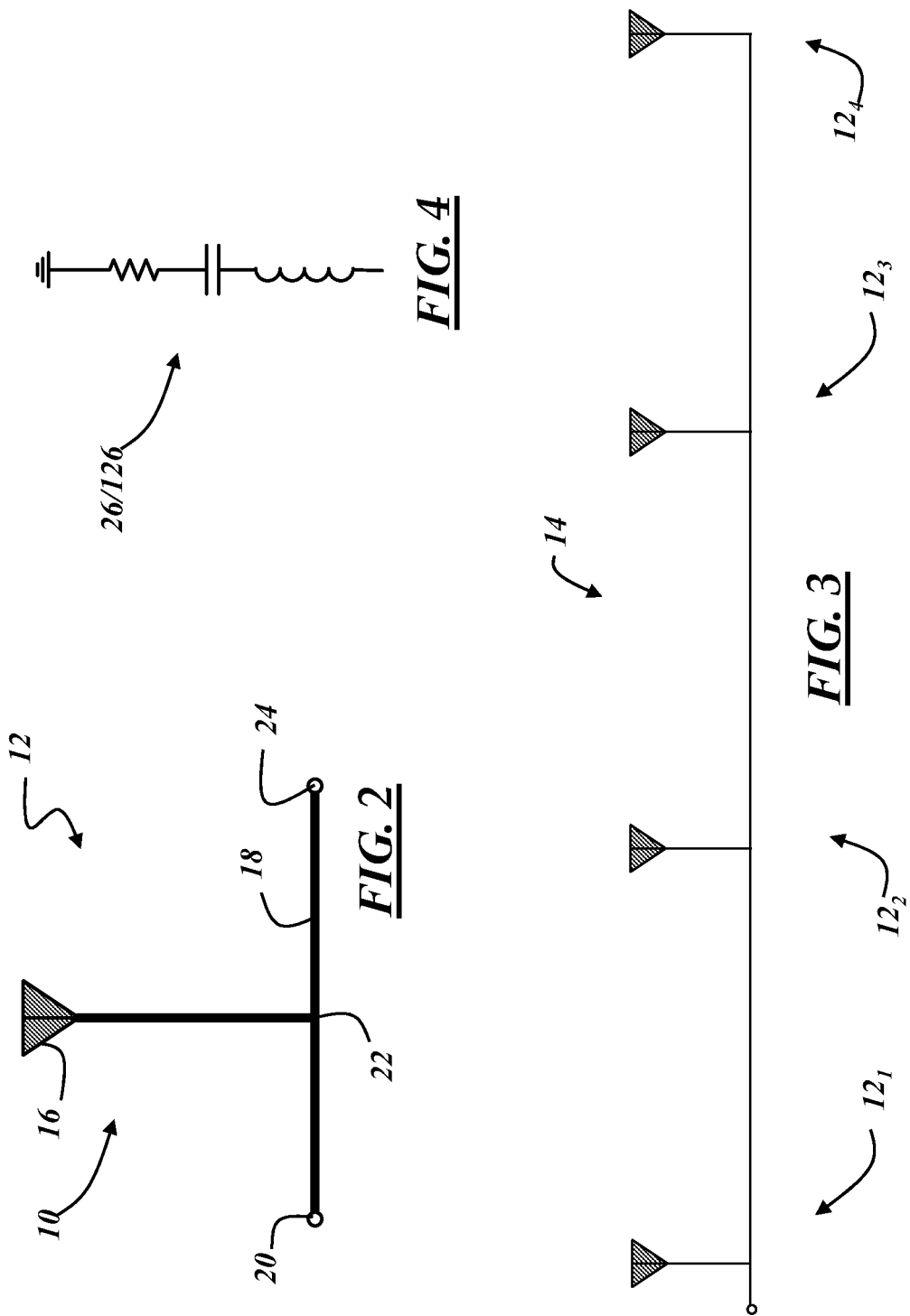

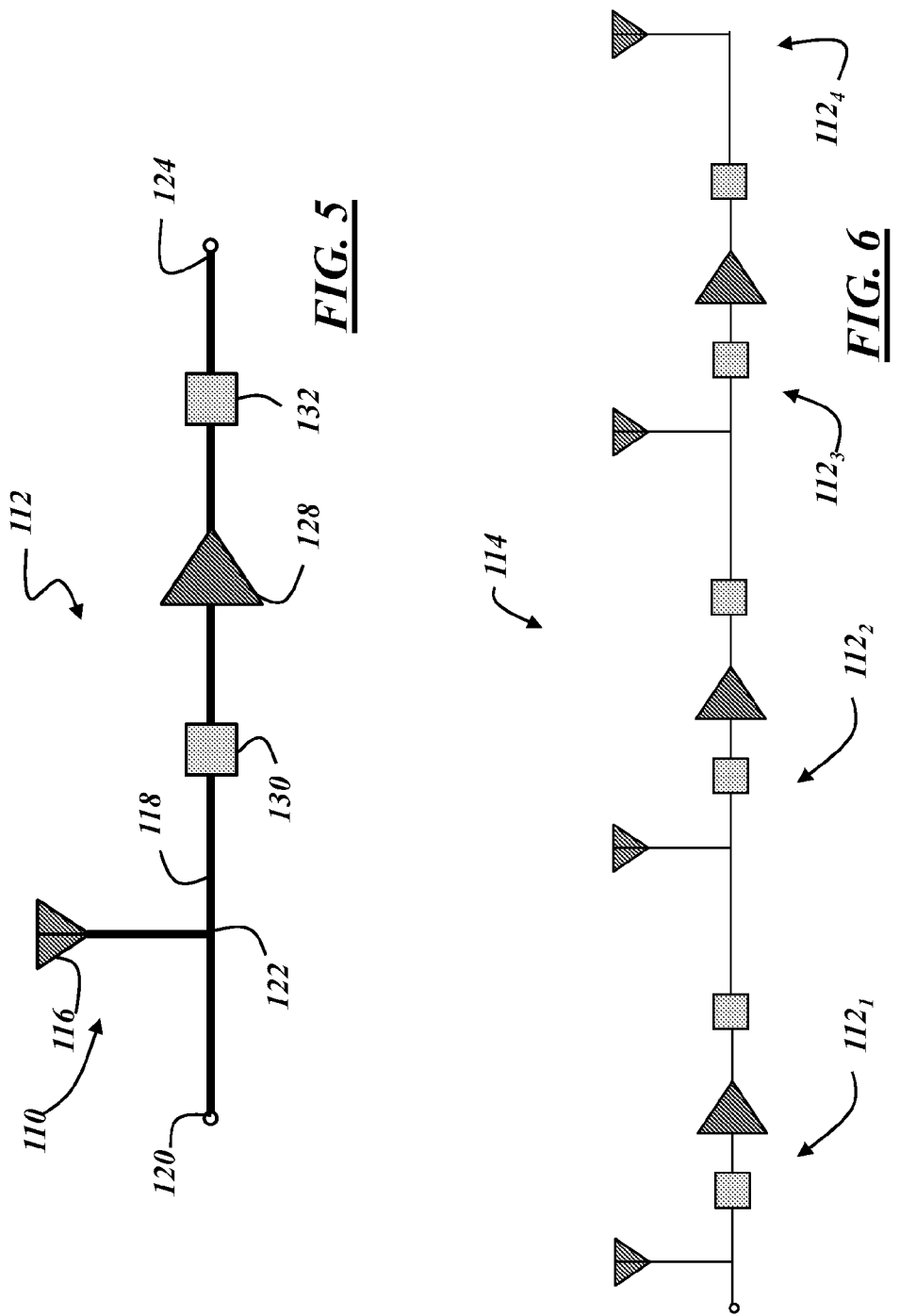

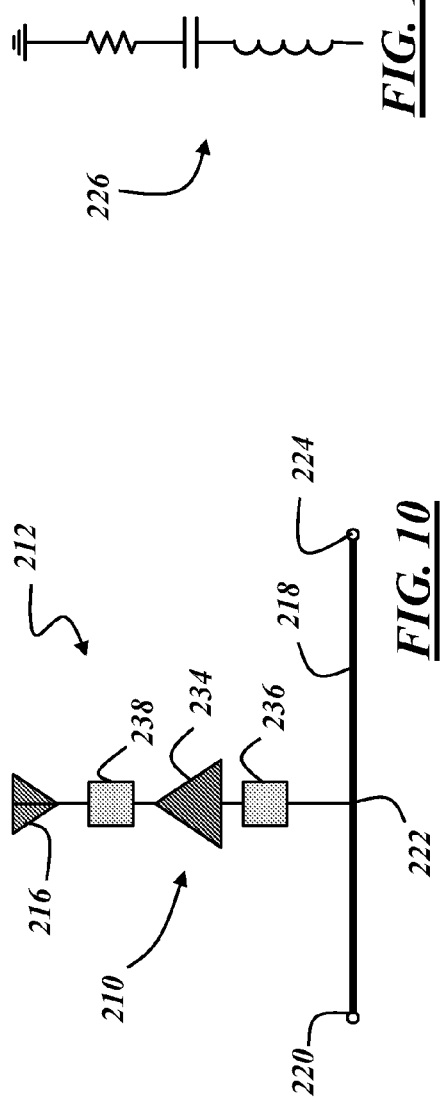
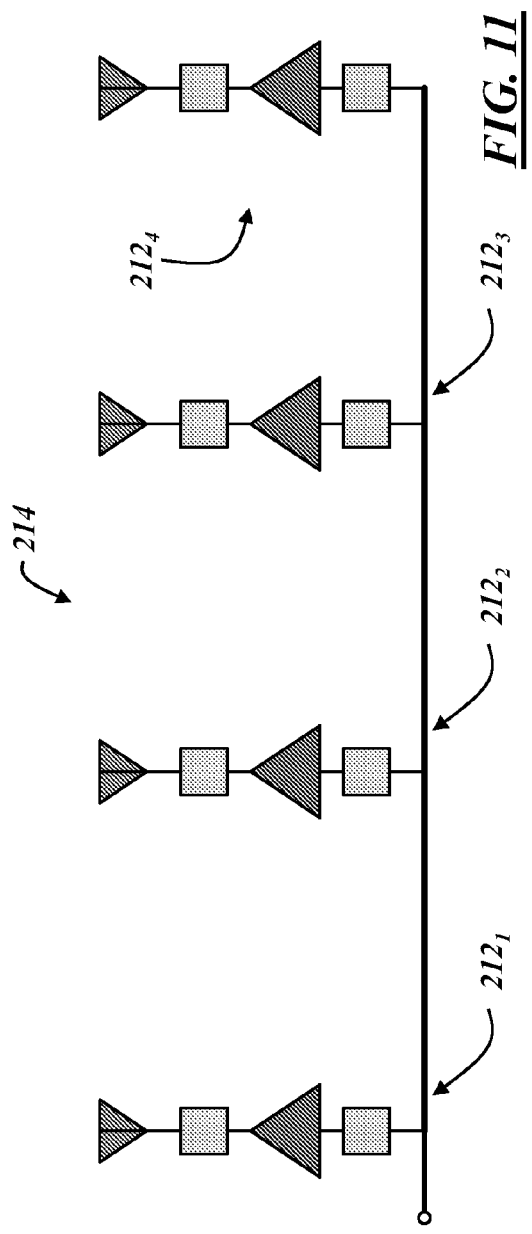

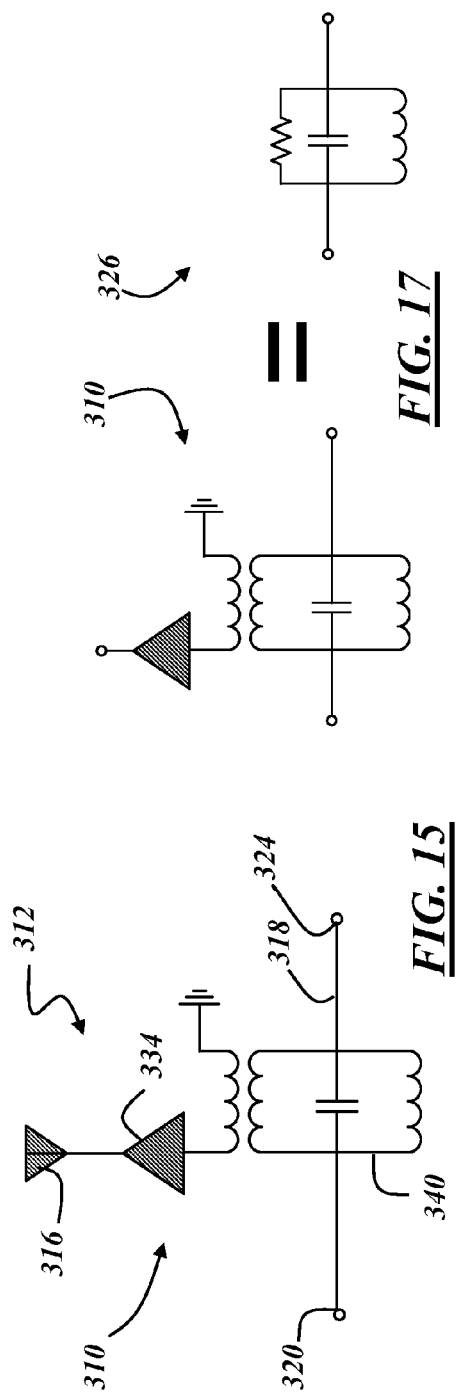

NEGATIVE GROUP DELAY CIRCUIT

TECHNICAL FIELD

The present disclosure relates generally to negative group delay (NGD) circuits, and more particularly, to NGD circuits for use in, for example, antenna arrays.

BACKGROUND

Antenna arrays are widely used in communication and radar systems because of their high directivity and ability to control beam direction. Some examples of these systems are military radars, vehicles collision avoidance systems, cellular base stations, satellite communication systems, broadcasting, naval communication, weather research, radio-frequency identification (RFID) and synthetic aperture radars. Antenna arrays are excited using either a serial or a corporate feed network. Serially-fed antenna arrays are more compact than their corporate-fed counterparts (e.g., serially-fed antenna arrays have a substantially shorter feeding or transmission line than corporate-fed arrays). Furthermore, the ohmic and feed line radiation losses are smaller in serially-fed arrays than in corporate-fed arrays. Hence, the efficiency of serially-fed arrays can be higher than that of corporate-fed arrays.

Serially-fed antenna arrays are not without their drawbacks, however. For example, serially-fed antenna arrays have a narrow bandwidth due to the non-zero group delay of the feed network causing variation of the phase shift with frequency between the antennas of adjacent antenna units. Therefore, beam direction varies (beam squint) as the frequency changes, thereby reducing the array boresight gain and causing performance degradation, especially in narrow beam width systems.

More particularly, the main beam angle of an antenna array is determined by phase shifts between adjacent antennas of the array. In serially-fed antenna arrays, the phase shift is adjusted using a frequency dependent phase shifter. Therefore, the antenna array beam angle changes as the frequency changes resulting in beam squinting given by equation (1):

$$\theta_{beam} = \sin^{-1}\left(\frac{\theta_f - \theta_{f_o}}{K_o d_E}\right) \quad (1)$$

where: $\theta_{beam}$ is the main beam angle, $\theta_{f_o}$ and $\theta_f$ are the phase shifts between any two of the adjacent antennas at the center frequency and at an offset frequency, respectively, and $d_E$ is the inter-element spacing (i.e., the space between adjacent antennas in the antenna array). According to equation (1), the beam squint occurs because the phase shift between the adjacent antennas varies with frequency. In order to eliminate the beam squint, the phase shift between the antennas must be frequency independent. In other words, the group delay, which is calculated from equation (2) below, between adjacent antennas must be zero.

$$\text{Group Delay} = -\frac{1}{2\pi}\frac{d\theta_f}{df} \quad (2)$$

To obtain a zero group delay between the adjacent antennas (and thereby eliminating, or at least substantially reducing, beam squint), one or more NGD circuit(s) may be integrated between the adjacent antennas. In such an instance, the NGD value must be equal to the value of the positive group delay of the interconnecting transmission lines. FIGS. 1A and 1B depict conventional serially-fed antenna array arrangements wherein NGD circuits are integrated between adjacent antennas to have an overall group delay of approximately zero. In FIG. 1A, and for each set of adjacent antennas, an NGD circuit comprising a lossy parallel resonance circuit is serially-integrated into the transmission line between the two antennas. In FIG. 1B, an NGD circuit comprising a lossy series resonator circuit is integrated into the transmission line in a shunt arrangement. In each of these arrangements, in order to have a uniformly excited antenna array, an amplifier and corresponding matching circuits can be used as illustrated in FIGS. 1A and 1B.

The use of conventional NGD circuits in this manner is not without its shortcomings, however. The conventional NGD circuits employ lossy elements (e.g., a lossy resonator) to generate a desirable amount of NGD. As such, these circuits suffer from a large amount of loss in order to generate NGD (e.g., certain conventional NGD circuits may have a typical loss of 6 dB or more, meaning that more than 70-75% of the power is dissipated in the NGD circuit), which significantly limits their application.

Accordingly, there is a need for NGD circuits that minimize and/or eliminate one or more of the above-identified deficiencies.

SUMMARY

According to one embodiment, a circuit for generating a negative group delay (NGD) comprises one or more electrical components, wherein at least one of the one or more electrical components has an input impedance that is sufficient for the electrical component(s) to exhibit a resonance behavior required to generate an NGD.

According to another embodiment, a circuit for generating an NGD comprises an antenna, wherein the antenna is configured to both radiate an electrical signal delivered thereto and to generate an NGD. In an embodiment, the antenna has an input impedance sufficient for the antenna to exhibit the resonance behavior required to generate the NGD.

In accordance with yet another embodiment, a circuit for generating an NGD comprises an amplifier, wherein the amplifier is configured to both amplify an electrical signal received thereby and to generate an NGD. In an embodiment, the circuit further includes a resonance circuit electrically connected in circuit with the amplifier, wherein the combination of the amplifier and the resonance circuit is configured to both amplify an electrical signal received thereby and to generate an NGD.

DESCRIPTION OF THE DRAWINGS

Preferred exemplary embodiments will hereinafter be described in conjunction with the appended drawings, wherein like designations denote like elements, and wherein:

FIG. 1A is a diagrammatic and schematic illustration of conventional serially-fed antenna array, wherein each antenna unit of the antenna array has an NGD circuit serially-integrated into the transmission line thereof;

FIG. 1B is a diagrammatic and schematic illustration of another conventional serially-fed antenna array, wherein each antenna unit of the antenna array has an NGD circuit integrated into the transmission line thereof in a shunt arrangement;

FIG. 2 is a diagrammatic and schematic illustration of an embodiment of an antenna unit comprising an NGD circuit, wherein the NGD circuit comprises an antenna that is configured to both radiate an electrical signal and generate an NGD;

FIG. 3 is a diagrammatic and schematic illustration of an embodiment of a serially-fed antenna array, wherein the array includes a plurality of the antenna units illustrated in FIG. 2;

FIG. 4 is a schematic illustration of an equivalent circuit of the antenna of the NGD circuit of the antenna unit illustrated in FIG. 3;

FIG. 5 is a diagrammatic and schematic illustration of another embodiment of an antenna unit comprising an NGD circuit, wherein the NGD circuit comprises an antenna that is configured to both radiate an electrical signal and generate an NGD;

FIG. 6 is a diagrammatic and schematic illustration of another embodiment of a serially-fed antenna array, wherein the array includes a plurality of the antenna units illustrated in FIG. 5;

FIG. 10 is a diagrammatic and schematic illustration of yet another embodiment of an antenna unit comprising an NGD circuit, wherein the NGD circuit comprises an amplifier that is configured to both amplify an electrical signal and generate an NGD;

FIG. 11 is a diagrammatic and schematic illustration of yet another embodiment of a serially-fed antenna array, wherein the array includes a plurality of the antenna units illustrated in FIG. 10;

FIG. 12 is a schematic illustration of an equivalent circuit of the amplifier of the NGD circuit of the antenna unit illustrated in FIG. 10;

FIG. 15 is a diagrammatic and schematic illustration of yet still another embodiment of an antenna unit comprising an NGD circuit, wherein the NGD circuit comprises an amplifier and a parallel resonance circuit;

FIG. 16 is a diagrammatic and schematic illustration of yet still another embodiment of a serially-fed antenna array, wherein the array includes a plurality of the antenna units illustrated in FIG. 15;

FIG. 17 is a schematic illustration of an equivalent circuit of the NGD circuit of the antenna unit illustrated in FIG. 15.

DETAILED DESCRIPTION

Figure 7:
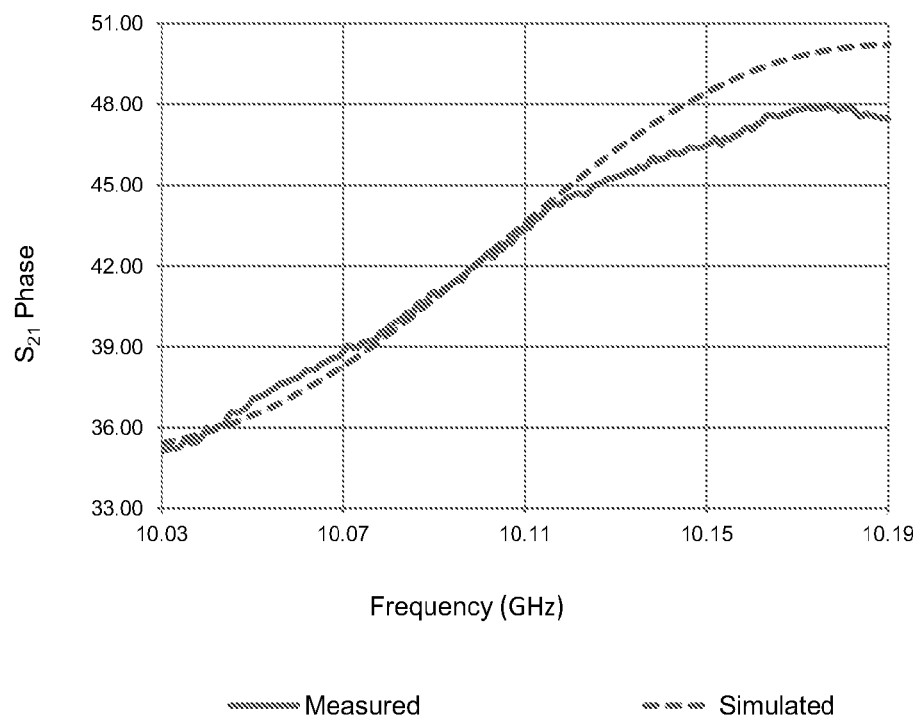
FIGS. 7-9 are graphical representations depicting various performance characteristics of an implementation of the NGD circuit of the antenna unit illustrated in FIG. 5.

In accordance with one aspect of the present disclosure, an NGD circuit that is lossless (i.e., does not suffer from reflection or insertion losses common in conventional NGD circuits) is provided. For purposes of this disclosure, the term "lossless" is intended to include instances wherein the circuit is perfectly lossless, and those instances wherein the circuit is not perfectly lossless, but the loss therein is within a predetermined tolerance deemed to be acceptable for the satisfactory performance of the circuit and/or a component of a system of which the NGD circuit is a part. In the NGD circuit of the present disclosure, instead of dissipating an electrical signal, and a radio frequency (RF) signal, in particular, within a lossy resonator (as is done in conventional NGD circuits, for example, those illustrated in FIGS. 1A and 1B), the signal is used by a circuit resembling, and having the resonant characteristics or behavior of, a lossy resonator (e.g., has an input impedance and/or quality factor similar to that of the lossy resonators of conventional NGD circuits), but without suffering from the loss attendant in such circuits. To that end, the lossless NGD circuit of the present disclosure is intended to replace the lossy resonator of conventional NGD circuits, such as, for example, those described above and illustrated in FIGS. 1A and 1B.

In various embodiments, and as will be described more fully below, the NGD circuit of the present disclosure may include, for example and without limitation, an antenna, an amplifier, or any other type of electrical component having a real part in its input impedance that provides the resonant characteristics required for generating NGD. The NGD circuit of the present disclosure may take a number of forms or implementations, each of which may be characterized by the absence of a lossy resonator and the ability to achieve a sufficient or desirable amount of NGD without such a lossy resonator. The NGD circuit may also be utilized in any number of applications. For purposes of illustration and clarity only, the description below will be primarily with respect to the use of the NGD circuit in a serially-fed antenna array implementation. It will be appreciated, however, that the use of the NGD circuit is not meant to be limited to such an implementation; rather it may be utilized in any number of other implementations, including, for example and without limitation, those described below. Accordingly, the present disclosure is not meant to be limited to the use of the NGD circuit in any particular implementation(s).

FIG. 2 illustrates an embodiment of a lossless NGD circuit 10 implemented in, for example, an antenna unit 12. The antenna unit 12 may, in turn, be incorporated into an antenna array, such as, for example, the serially-fed antenna array 14 illustrated in FIG. 3, which includes a plurality of antenna units 12 (e.g., antenna units $12_1$, $12_2$, $12_3$, $12_4$). In the illustrated embodiment, the NGD circuit 10 comprises an antenna 16, and therefore, comprises an antenna-based NGD circuit, and is electrically connected with or integrated into a transmission line 18 of the antenna unit 12 in a shunt arrangement.

In the illustrated embodiment, in addition to the NGD circuit 10 (i.e., the antenna 16) and one or more transmission lines 18, the antenna unit 12 further comprises an input 20, a power divider 22, and an output 24. Each of the antenna 16 of the NGD circuit 10 and the power divider 22 may respectively comprise any suitable antenna and power divider known in the art, and therefore, are not limited to any particular components. However, in an embodiment, and for purposes of illustration only, the antenna 16 may comprise one of a patch, yagi (e.g., printed yagi), dipole, parabolic reflector, horn, or any other suitable antenna; and the power divider 22 may comprise a three-way power divider, for example a T-junction or a Wilkinson power divider, that is electrically connected in circuit between the input 20, the NGD circuit 10 (antenna 16), and the output 24.

In an embodiment, the antenna 16 of the NGD circuit 10 is designed to exhibit the appropriate resonance characteristics or behavior so that the antenna 16 resembles, and performs the functionality of, a conventional NGD circuit (such as, for example, that illustrated in FIG. 1B), but without requiring the use of a lossy components, for example, a lossy resonator. Accordingly, the antenna 16 is configured not only as a radiating element for transmitting electrical signals (e.g., RF signals), but is configured and operative both as a radiating element and as an NGD circuit for generating a NGD. To that end, the antenna 16, or the resonator formed thereby, may have an equivalent circuit 26 like that illustrated in FIG. 4. In such an embodiment, instead of dissipating the electrical signal (e.g., RF signal) into a lossy resonator, as is done in conventional arrangements such as those illustrated in FIGS. 1A and 1B, the signal is radiated by the antenna 16, and therefore, the circuit 10 comprises a lossless NGD circuit. Hence, the antenna array 14 shown in FIG. 3 does not suffer from the beam squint effect described above and attendant in conventional antenna arrays wherein lossy resonators are used to generate NGD, as a relatively little amount of beam squint (if any) occurs during the operation of the antenna array 14 and the antenna units 12 thereof, in particular.

In an embodiment, the antenna 16 generates an NGD that is the same as that of the positive group delay generated in the transmission lines 18 interconnecting the antenna unit 12 to an adjacent antenna unit 12 (e.g., in the transmission line connecting antenna unit 12$_1$ to antenna unit 12$_2$). As a result, the phase shift between the adjacent antennas 16 does not vary with frequency variation and no beam squint occurs. It will be appreciated, that in other embodiments, the NGD value may not be the same as the positive group delay, and therefore, may cancel out some but not all of the positive group delay. In such an embodiment, the positive group delay may be reduced but not eliminated. Such embodiments remain within the spirit and scope of the present disclosure.

The particular bandwidth and the NGD value generated by the antenna 16 depend primarily on the input impedance and quality factor of the antenna 16. Specifically, the NGD value is inversely proportional to the input impedance and directly proportional to the quality factor; while the bandwidth is inversely proportional to the quality factor. Accordingly, the magnitude of the input impedance and/or the quality factor of the antenna 16 are such that the antenna 16 exhibits the resonance characteristics or behavior required to generate an NGD. Thus, for a particular implementation or application, an antenna may be selected that has the necessary input impedance and/or quality factor sufficient to generate an NGD of a suitable value to cancel out at least a portion of the positive group delay generated by the transmission lines of the antenna unit and/or the electrical components disposed therein (e.g., to achieve a net group delay that is equal to zero). Therefore, in an embodiment, the antenna 16 (or the impedance and/or quality factor thereof) may be designed or selected to match the known positive group delay of the transmission lines 18 of the antenna unit 12. Furthermore, the magnitude of the input signal level to each antenna 16 of the antenna array 14 can be adjusted by proper design of the T-junction power divider 22 and the input impedance of the antenna 16. Hence, either an equally-fed or tapered array can be designed.

For purposes of illustration only, and with reference to FIG. 2, an example of one particular implementation of an antenna unit having an antenna-based NGD circuit will be provided. In this particular example, assume that the transmission line 18 of the antenna unit 16 is a one-wavelength long transmission line and that the positive group delay generated thereby is approximately 1 ps. In order to generate an NGD that cancels such a positive group delay, the antenna 16 is designed to have an input impedance of approximately 50Ω and a quality factor, or "Q", of 40. It will be appreciated that the present disclosure is not meant to be limited to such an example or implementation; rather, depending on the particular characteristics of the antenna unit 12 or the overall antenna array 14, and/or the desired performance or operation thereof, any number of other implementations are possible and remain within the spirit and scope of the present disclosure.

In order to design large arrays and provide further design flexibility, an antenna unit may include any number of components in addition to those described above with reference to the embodiment illustrated in FIGS. 2 and 3 (i.e., in addition to the input 20, NGD circuit 10 (antenna 16), power divider 22, and output 24). For example, FIG. 5 depicts an illustrative embodiment of an antenna unit 112 that may be incorporated into an antenna array, such as, for example, the serially-fed array 114 illustrated in FIG. 6, which comprises a plurality of antenna units 112 (e.g., antenna units 112$_1$, 112$_2$, 112$_3$, 112$_4$).

In such an embodiment, the antenna unit 112 includes a lossless antenna-based NGD circuit 110 that is the same as or similar to the NGD circuit 10 described above, and that is electrically connected in a shunt arrangement with the transmission line 118 of the antenna unit 112. In addition to an input 120, a power divider 122, and an output 124, the antenna unit 112 may further comprise an amplifier 128, and, in an embodiment, corresponding matching circuits 130, 132. Each of the power divider 122, antenna 116 of the NGD circuit 110, and amplifier 128 (and, if applicable, matching circuits 130, 132) may respectively comprise any suitable power divider, antenna, and amplifier (and matching circuits) known in the art, and therefore, are not limited to any particular components. However, in an embodiment and for purposes of illustration only, the power divider 122 may comprise a three-way power divider, for example a T-junction or a Wilkinson power divider, that is electrically connected in circuit between the input 120, the NGD circuit 110 (antenna 120), and the amplifier 128 (with the amplifier being electrically connected in circuit between the power divider 122 and the output 124); and the antenna 116 of the NGD circuit 110 may comprise one of a patch, yagi (e.g., printed yagi), dipole, parabolic reflector, horn, or any other suitable antenna.

In the illustrated embodiment, the antenna 116 of the NGD circuit 110 is designed to exhibit the appropriate resonance characteristics or behavior so that the antenna 116 resembles, and performs the functionality of, a conventional NGD circuit (such as that illustrated in FIG. 1B), but without requiring the use of a lossy components, for example, a lossy resonator. Accordingly, the antenna 116 is configured not only as a radiating element for transmitting electrical signals (e.g., RF signals), but is configured and operative both as a radiating element and as an NGD circuit for generating an NGD. To that end, the antenna 116, or the resonator formed thereby, may have the equivalent circuit 126 illustrated in FIG. 4. In this embodiment, instead of dissipating the RF signal into a lossy resonator, as is done in conventional NGD circuits such as those illustrated in FIGS. 1A and 1B, the signal is radiated by the antenna 116, and therefore, the circuit 110 comprises a lossless NGD circuit. Hence, the antenna array 114 shown in FIG. 6 can be designed such that it does not suffer from the beam squint effect described above and attendant in conventional antenna arrays wherein lossy resonators are used to generate NGD, as a relatively little amount of beam squint (if any) occurs during the operation of the antenna array 114 and the antenna units 112 thereof, in particular.

In an embodiment, the antenna 116 generates an NGD having the same value as that of the positive group delay generated in the transmission line 118 interconnecting the antenna unit 112 to an adjacent antenna unit 112 (e.g., the transmission line 118 connecting antenna unit $112_1$ to antenna unit $112_2$), which includes the positive group delay contributed by the amplifier 128 disposed therein as well. As a result, in an embodiment, the phase shift between the adjacent antennas 116 does not vary with frequency variation, and no beam squint occurs. It will be appreciated, that in other embodiments, the NGD value may not be the same as the positive group delay, and therefore, may cancel out some but not all of the positive group delay. In such an embodiment, the positive group delay may be reduced but not eliminated. Such embodiments remain within the spirit and scope of the present disclosure.

As with the embodiment described above with respect to the antenna unit 12, the particular bandwidth and the NGD value generated by the antenna 116 depend primarily on the input impedance and quality factor of the antenna 116. Specifically, the NGD value is inversely proportional to the input impedance and directly proportional to the quality factor; while the bandwidth is inversely proportional to the quality factor. Accordingly, the magnitude of the input impedance and/or the quality factor of the antenna 116 are such that the antenna 116 exhibits the resonance characteristics or behavior required to generate an NGD. Thus, for a particular implementation or application, an antenna may be selected that has the necessary input impedance and/or quality factor sufficient to generate an NGD of a suitable value to cancel out at least a portion of the positive group delay generated by the transmission line 118 and/or the electrical components disposed or integrated therein (e.g., to achieve a net group delay that is equal to zero). Therefore, in an embodiment, an antenna (or the impedance and/or quality factor thereof) may be designed or selected to match the known positive group delay of the transmission lines 118 of the antenna unit 112.

Most of the input signal provided to the antenna unit 112, and to the input 120 thereof, in particular, is delivered to the antenna 116 via the power divider 122; however, a small portion of the power is also delivered from the power divider 122 to the amplifier 128, which amplifies the power signal. The amplified signal is then used as the input to the next, adjacent antenna unit 112 of the array 114. In an embodiment, it may be desirable for the input power signals to each antenna unit 112 of the antenna array 114 to have the same magnitude. In such an embodiment, the amplifier 128 and, if applicable, the corresponding matching circuits 130, 132 illustrated in FIG. 5 are configured such that the signal received thereby is amplified to such a degree that, in an embodiment, the magnitude of the output signal of the antenna unit 112 is equal to that of the input signal, and thus, the input signal to the next, adjacent antenna unit 112—which comprises the output signal of the immediately previous antenna unit—is at least substantially equal to that of the immediately previous antenna unit 112. For example, and with reference to the antenna array 114 illustrated in FIG. 6, in an embodiment, the amplifier 128 and corresponding matching circuits 130, 132 of the antenna unit $112_1$ are configured such that the signal received thereby is amplified to such a degree that the magnitude of the output signal of the antenna unit $112_1$ is at least substantially equal to that of the input signal, and thus, the input signal to the antenna unit $112_2$ is at least substantially equal to that of the antenna unit $112_1$. In other embodiments, however, it may be desirable for the magnitudes of the input power signals of adjacent antenna units to be different or unequal, and therefore, the magnitudes of the input power signal and output power signals of a single antenna unit to also be different or unequal. In such embodiments, the amplifier 128 and, if applicable, matching circuits 130, 132, may be configured to achieve whatever input/output signal ratio that is desired.

With respect to FIG. 5, and for purposes of illustration only, an example of one particular implementation of an antenna unit having an antenna-based NGD circuit will be provided. In this particular example, assume that the transmission line 118 of the antenna unit 112 is a one-wavelength long transmission line and that the positive group delay generated thereby is approximately 1 ps. In order to generate an NGD that cancels such a positive group delay, the antenna 116 is designed to have an input impedance of approximately 50Ω and a quality factor, or "Q", of 40. The amplifier 128, which, in an embodiment, is designed to have a gain that is similar or equivalent to the power dividing ratio of the power divider 122, has a gain of 15 dB. It will be appreciated that the present disclosure is not meant to be limited to such an example or implementation; rather, depending on the particular characteristics of the antenna unit 112 or the overall antenna array 114, and/or the desired performance or operation thereof, any number of other implementations are possible and remain within the spirit and scope of the present disclosure.

Figure 8:
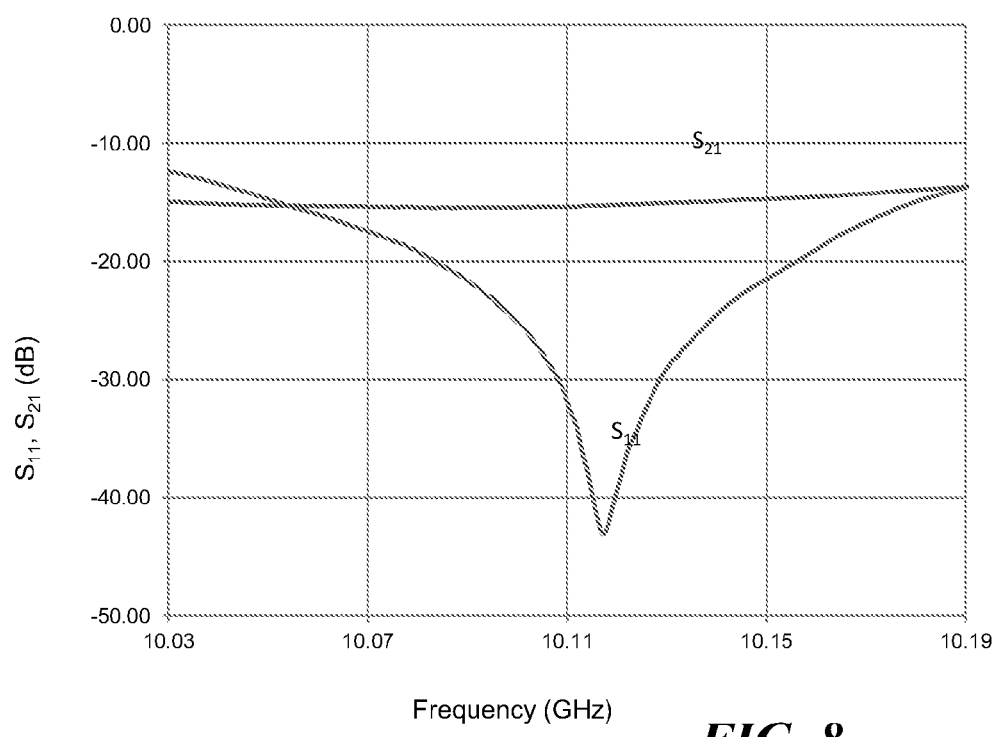
Figure 9:
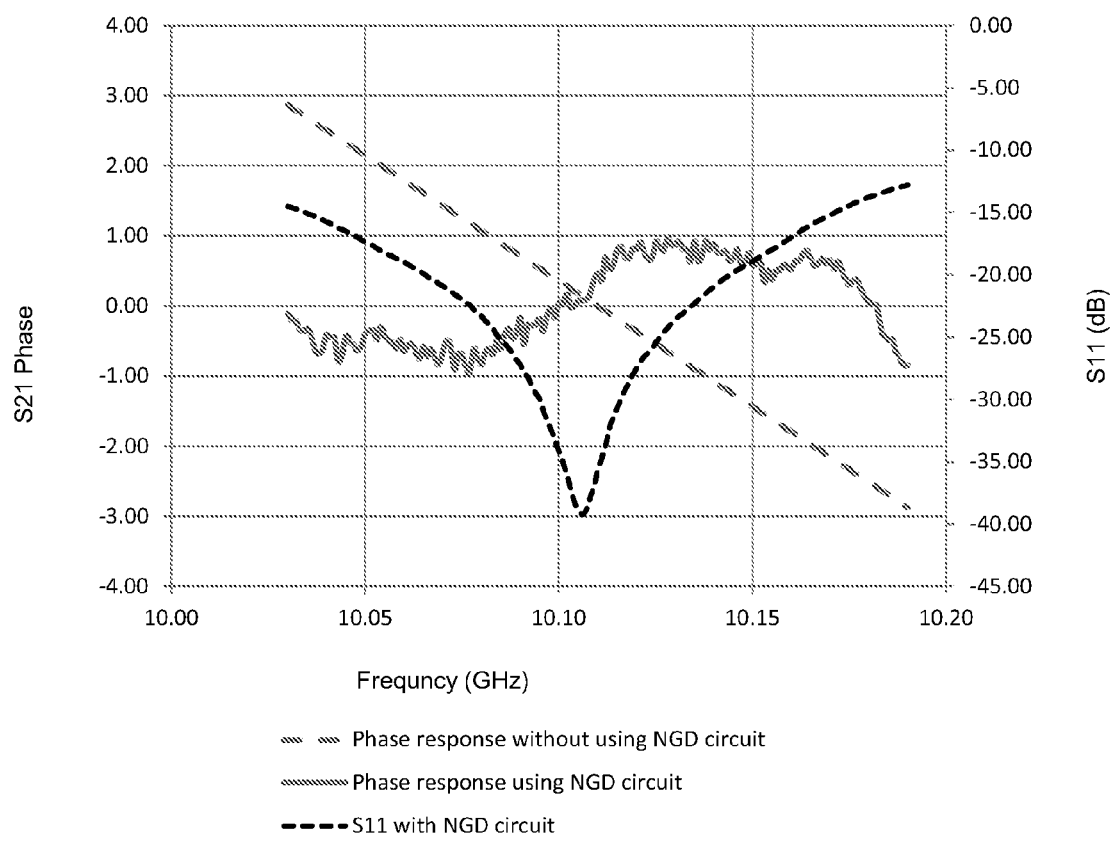

With reference to FIGS. 7-9, and for purpose of illustration only, a description of the performance of one particular implementation of an antenna-based NGD circuit, namely that described above, will now be provided. It is known that the phase of the transmission coefficient (i.e., $S_{21}$) of any transmission medium decreases as the frequency of the signal increases resulting in a positive group delay that can be calculated from equation (2) above. However, in the NGD circuit 110 described above, the phase of the transmission coefficient increases as the frequency increases as shown in FIG. 7. The measured NGD is in the frequency range from 10.03 GHz to 10.19 GHz, which is the same frequency range where the antenna is matched. As illustrated in FIG. 8, the measured magnitude of the transmission coefficient is −15 dB, with a reflection coefficient magnitude of −40 dB, indicating that most of the power input into the antenna unit 112 is delivered to the antenna 116. FIG. 9 shows a comparison between the measured phase variation of this implementation and a one-wavelength transmission line with frequency. A phase variation of 2° has been achieved in the transmission line over 160 MHz, as compared to a 5.8° phase variation using a conventional serially-fed antenna array. As can be calculated from equation (1) above, this phase variation corresponds to less than 0.4° of beam squint.

It will be appreciated by those having ordinary skill in the art that the above-described performance relates to one particular implementation of an antenna-based NGD circuit and that the present disclosure is not intended to be limited to such an implementation. Rather, it is contemplated that an antenna-based NGD may be implemented in a number of suitable ways other than that corresponding to the performance characteristics described above, and each such implementation remains within the spirit and scope of the present disclosure.

While the description has thus far been with respect to lossless NGD circuits comprising an antenna that is configured to generate NGD, the present disclosure is not meant to be limited to such antenna-based circuits; rather, lossless NGD circuits comprising electrical components other than an antenna are also within the spirit and scope of the present disclosure. For example, FIG. 10 illustrates an embodiment of a lossless NGD circuit 210 that comprises an amplifier 234 (and, in an embodiment, corresponding matching circuits 236, 238) that is configured to generate an NGD. The NGD circuit 210 may be implemented in an antenna unit 212 that, in turn, may be incorporated into an antenna array, such as, for example, the serially-fed antenna array 214 illustrated in FIG. 11. In the illustrative embodiment depicted in FIG. 11, the antenna array 214 comprises a plurality of antenna units 212 (e.g., antenna units $212_1$, $212_2$, $212_3$, $212_4$).

As shown in FIG. 10, in addition to the NGD circuit 210, the antenna unit 212 may further include one or more transmission lines 218, an input 220, a power divider 222, an antenna 216, and an output 224. Each of the amplifier 234 and matching circuits 236, 238 (if applicable) of the NGD circuit 210, power divider 222, and antenna 216 may respectively comprise any suitable amplifier, mixer, filter, matching circuit(s), power divider, and antenna known in the art, and therefore, are not limited to any particular components. However, in an embodiment, and for purposes of illustration only, the matching circuits may comprise microstrip or lumped element matching circuits, the power divider may comprise a three-way power divider, for example a T-junction or a Wilkinson power divider, that is electrically connected in circuit between the input 220, the NGD circuit 210, and the output 224 of the antenna unit 212, and the antenna 216 may comprise one of a patch, yagi (e.g., printed yagi), dipole, parabolic reflector, horn, or any other suitable antenna.

In the illustrated embodiment, the amplifier 234 and, in an embodiment, the corresponding matching circuits 236, 238, are designed to exhibit the appropriate resonance characteristics or behavior so as to resemble, and perform the functionality of, a conventional NGD circuit (such as that illustrated in FIG. 1B) without requiring the use of lossy components, for example, a lossy resonator. Accordingly, the amplifier 234 and matching circuits 236, 238 are configured and operative not only as an amplifier for amplifying electrical signals (e.g., power signals), but are configured and operative both as an amplifier and as a NGD circuit for generating an NGD. To that end, the amplifier 234, or the resonator formed thereby, may have an equivalent circuit 226 such as that illustrated in FIG. 12. In this embodiment, instead of dissipating the RF signal into a lossy resonator, as is done in conventional NGD circuits such as those illustrated in FIGS. 1A and 1B, the signal is amplified by the amplifier 234, and therefore, the circuit 210 comprises a lossless NGD circuit.

In an embodiment, the amplifier 234 and, if applicable, matching circuits 236, 238, generate(s) an NGD that having a value that is equal to the positive group delay generated in the transmission line 218 interconnecting the antenna unit 212 to an adjacent antenna unit 212 (e.g., the transmission line 218 connecting antenna unit $212_1$ to antenna unit $212_2$). As a result, the phase shift between the adjacent antennas 216 does not vary with frequency variation, and no beam squint occurs. It will be appreciated, however, that in other embodiments, the NGD value may not be the same as the positive group delay, and therefore, may cancel out some but not all of the positive group delay. In such an embodiment, the positive group delay may be reduced but not eliminated. Such embodiments remain within the spirit and scope of the present disclosure.

The particular bandwidth and the NGD value generated by the amplifier 234 (and, if applicable, the matching circuits 236, 238) depend primarily on the input impedance of the amplifier 234 and the quality factor of the amplifier 234 and/or the matching circuits 236, 238 thereof. Specifically, the NGD value is inversely proportional to the input impedance and directly proportional to the quality factor; while the bandwidth is inversely proportional to the quality factor. Accordingly, the magnitude of the input impedance of the amplifier 234 and/or the quality factor of the amplifier 234 and/or matching circuits 236, 238 are such that the amplifier 234 alone or a combination of the amplifier 234 and the corresponding matching circuits 236, 238 exhibits the resonance characteristics or behavior required to generate an NGD. Thus, for a particular implementation or application, an amplifier 234 and/or amplifier matching circuits 236, 238 may be selected that have the necessary input impedance and/or quality factor sufficient to generate an NGD of a suitable value to compensate for or cancel out the positive group delay generated by the transmission lines 218 of the antenna unit 212 (e.g., to achieve a net group delay that is equal to zero). Thus, in an embodiment, an amplifier and/or amplifier matching circuits (or the impedance and/or quality factor thereof) may be designed or selected to match the known positive group delay of the transmission lines 218 of the antenna unit 212.

With respect to FIG. 10, and for purposes of illustration only, an example of a particular implementation of an antenna unit having an amplifier-based NGD circuit will be provided. In this particular example, assume that the transmission 218 of the antenna unit 212 is a one-wavelength long transmission line that generates a positive group delay of approximately 1 ps. Assume further that the matching circuits 236, 238 of the amplifier 234 are implemented using microstrip series and shunt stubs. In order to generate an NGD that cancels such a positive group delay, the amplifier 234 is designed to have an input impedance of approximately 50Ω, and the quality factor, or "Q", of the amplifier 234 with its matching circuits 236, 238 is approximately 10. Additionally, the gain of the amplifier 234, which is intended to be similar or equivalent to the power dividing ratio of the power divider 222, is around 15 dB. It will be appreciated that the present disclosure is not meant to be limited to such an example or implementation; rather, depending on the particular characteristics of the antenna unit or the overall antenna array and/or the desired performance or operation thereof, any number of other implementations are possible and remain within the spirit and scope of the present disclosure.

Figure 13:
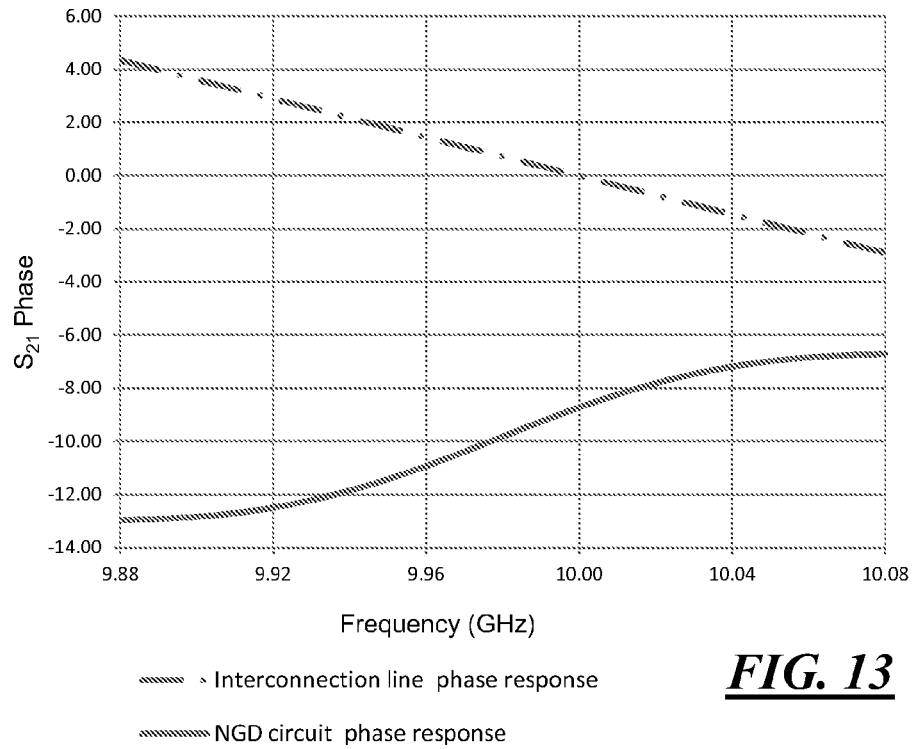
FIGS. 13 and 14 are graphical representations depicting various performance characteristics of an implementation of the NGD circuit of the antenna unit illustrated in FIG. 5.
Figure 14:
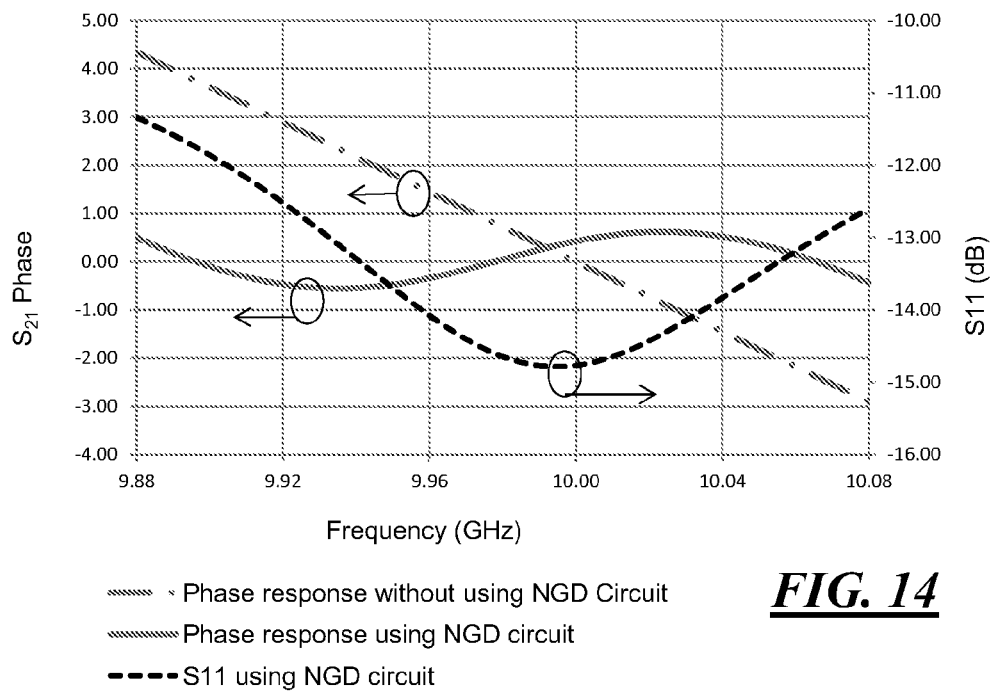

The above-described amplifier-based NGD circuit 210 was tested and its performance was compared to that of the simulation results shown in FIG. 13. It was found that integrating the NGD circuit 210 in the manner illustrated in FIG. 10 reduces the phase shift variation with frequency and minimizes beam squint as compared to conventional circuits. The phase variation of one active antenna unit 212 has been compared with a one-wavelength transmission line 218 using the simulation results shown in FIG. 14. A phase variation of 1.17° has been achieved in the transmission line 218 over 200 MHz as compared to a 7.2° phase variation using a conventional serially-fed antenna array. As can be calculated from equation (1) above, this phase variation corresponds to less than 0.25° of beam squint.

It will be appreciated by those having ordinary skill in the art that the above-described performance relates to one particular implementation of an amplifier-based NGD circuit and that the present disclosure is not intended to be limited to such an implementation. Rather, it is contemplated that an amplifier-based NGD may be implemented in a number of suitable ways other than that corresponding to the performance characteristics described above, and each such implementation remains within the spirit and scope of the present disclosure.

While the description above has been with respect to lossless NGD circuits that are antenna- or amplifier-based, the present disclosure is not meant to be so limited. Rather, in other embodiments, any electrical component or device having a sufficient input impedance (i.e., real values in its input impedance) and quality factor (or a circuit electrically coupled thereto configured to provide a required quality factor), such as, for example, filters, mixers, and couplers, to cite a few possibilities, may be used in addition to or in place of the antenna and/or amplifier described above to generate NGD. Accordingly, the present disclosure is not meant to be limited to any particular type(s) of lossless NGD circuits.

Additionally, while the description above has been with respect to "shunt-type" NGD circuits (i.e., NGD circuits that are electrically connected or integrated in a transmission line in a shunt arrangement), in other embodiments, the lossless NGD circuit may be electrically connected in series with a transmission line. FIG. 15 depicts an illustrative embodiment of one such "series-type" NGD circuit 310. The NGD circuit 310 comprises a lossless, amplifier-based NGD circuit, that, in the illustrated embodiment, comprises an amplifier 334 connected in circuit (e.g., in parallel) with a lossless resonance circuit (e.g., a parallel resonance circuit) 340. In this embodiment, each of the amplifier 334 and the resonance circuit 340 may comprise any suitable amplifier and resonance circuit known in the art, and therefore, are not limited to any particular components. In other embodiments, rather than the resonance circuit 340 being separate and distinct from the amplifier 334, it may be integrated within the amplifier 334 such that it does not comprise a separate and distinct component of the NGD circuit 310 (e.g., the parasitic elements of the amplifier 334 may serve the purpose of the shunt capacitor and/or the shunt inductor of the resonance circuit 340); or may be integrated within one or more amplifier matching circuits; or may be otherwise provided. Accordingly, the present disclosure is not limited to any one particular implementation or arrangement of the NGD circuit 310. For purposes of illustration, however, the description below will be with respect to the embodiment of the NGD circuit 310 illustrated in FIG. 15.

As shown in FIG. 15, the NGD circuit 310 may be implemented in an antenna unit 312, which, in turn, may be incorporated into an antenna array, such as, for example, the serially-fed antenna array 314 illustrated in FIG. 16. As with the serially-fed antenna arrays described above, the antenna array 314 comprises a plurality of antenna units 312 (e.g., antenna units $312_1$, $312_2$, $312_3$). In addition to the NGD circuit 310, the antenna unit 312 may further include one or more transmission lines 318, an input 320, an antenna 316, and an output 324. As with the embodiments described above, the antenna 316 may comprise any suitable antenna known in the art, and therefore, is not limited to any particular components. However, in an embodiment, and for purposes of illustration only, the antenna 316 may comprise any one of a patch, yagi (printed yagi), dipole, parabolic reflector, horn, or any other suitable antenna.

In the illustrated embodiment, the amplifier 334 and the parallel resonance circuit 340 are designed to exhibit the appropriate resonance characteristics or behavior so as to resemble, and perform the functionality of, an NGD circuit (such as that illustrated in FIG. 1A) without requiring the use of lossy components, for example, a lossy resonator. Accordingly, the amplifier 334 is configured not only as an amplifier for amplifying electrical signals (e.g., power signals), but is configured and operative both as an amplifier and as an NGD circuit for generating an NGD. To that end, the amplifier 334 and the resonance circuit 340 may have an equivalent circuit 326 such as that illustrated in FIG. 17. In this embodiment, instead of dissipating the RF signal into a lossy resonator, as is done in conventional NGD circuits such as those illustrated in FIGS. 1A and 1B, the signal is amplified by the amplifier 334 and therefore the circuit comprises a lossless NGD circuit.

In the embodiment illustrated in FIG. 15, the amplifier 334 and resonance circuit 340 may generate an NGD having a value that is the same as that of the positive group delay generated in the transmission line 318 interconnecting the antenna unit 312 to an adjacent antenna unit 312 (e.g., in the transmission line connecting antenna unit $312_1$ to antenna unit $312_2$). As a result, the phase shift between the adjacent antennas does not vary with frequency variation, and no beam squint occurs. It will be appreciated, however, that in other embodiments, the NGD value may not be the same as the positive group delay, and therefore, may cancel out some but not all of the positive group delay. In such an embodiment, the positive group delay may be reduced but not eliminated. Such embodiments remain within the spirit and scope of the present disclosure.

The particular bandwidth and the NGD value generated by the combination of the amplifier 334 and resonance circuit 340 depend primarily on the input impedance of the amplifier 334 and the quality factor of the resonance circuit 340. Specifically, the NGD value is directly proportional to the input impedance and the quality factor; while the bandwidth is inversely proportional to the quality factor. Accordingly, the magnitude of the input impedance of the amplifier 334 and/or the quality factor of the resonance circuit 340 are such that the combination of the amplifier 334 and resonance circuit 340 exhibits resonance characteristics required to generate an NGD. Thus, for a particular application, an amplifier and/or resonance circuit may be selected that have the necessary input impedance and/or quality factor sufficient to generate an NGD of a suitable value to cancel out completely or at least a portion of the positive group delay generated by the transmission line of the antenna unit (e.g., to achieve a net group delay that is equal to zero). Thus, in an embodiment, an amplifier and/or resonance circuit (or the impedance and/or quality factor thereof) may be selected to match the known positive group delay of the transmission line 318 of the antenna unit 312.

It will be appreciated that while the description above has been primarily with respect to an amplifier-based, "series-type" NGD circuit, the present disclosure is not meant to be so limited. Rather, in other embodiments, any electrical component or device having real values in their input impedance, such as, for example, filters, mixers, and couplers, to cite a few possibilities, may be used in addition to or in place of the amplifier 334 and/or resonance circuit 340 described above to generate an NGD. Accordingly, the present disclosure is not meant to be limited to any particular type(s) of series-type, lossless NGD circuits.

Additionally, while the description has been thus far been limited to the use of the lossless NGD circuits described herein in the context of antenna arrays, and serially-fed antenna arrays, in particular, the present disclosure is not meant to be limited to such an implementation. For instance, the NGD circuits described above may also be utilized or implemented in, for example and without limitation, cascade amplifiers and transversal equalizers. Transversal equalization is used to eliminate the effect of multi-path propagation in wireless communication or the spectral distortion in wire-based communication. Conventional transversal equalizers suffer from a frequency dependent phase shift. However, the NGD circuits of the present disclosure may allow for the design of a frequency-independent phase shifter which will improve the system bandwidth. Accordingly, the present disclosure is not meant to be limited to any one particular implementation or use of the NGD circuits described herein.

In any event, the NGD circuits of the present disclosure may lend themselves to use in a variety of different applications, including, but not limited to: defense applications; oil and mining applications; space applications; automotive applications; and telecommunication applications; to cite a few possibilities. More particularly, in defense applications, corporate-fed phased array military radar systems may be replaced with serially-fed systems that include the NGD circuits described above, which may provide lower costs, higher efficiencies, and smaller sizes than the corporate-fed systems. In oil and mining applications, the NGD circuits of the present disclosure may be used to design a compact and high power Synthetic Aperture Radar (SAR) system that can be used for oil and mineral exploration from an aircraft. Such a system may reduce exploration costs and increase the speed of the exploration process. In space applications, the NGD circuits of the present disclosure may be used to design compact, efficient, reliable, and low-cost communication systems. In automotive applications, the NGD circuits may be used to build compact and low-cost radar systems for use in collision avoidance systems, for example. In telecommunications applications, by using the NGD circuits described above, the footprint of individual cells in a cellular network may be controlled. Additionally, the NGD circuits may be used to eliminate, or at least significantly and/or substantially mitigate, the effects of multi-path propagation in wireless communication or the spectral distortion in optical fiber links. Accordingly, the NGD circuits described herein may be utilized in any number of applications.

It will be appreciated in view of the foregoing that one advantage of the present disclosure, though certainly not the only one, is that each of the NGD circuits described above is configured to generate or achieve a desirable amount of NGD without requiring the use of lossy elements or components to do so, as is done in conventional NGD circuits. As such, the desired NGD may be achieved without also suffering or having to account for the losses attendant in conventional NGD circuits that employ such lossy elements to generate or achieve a desirable amount of NGD.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Further, the term "electrically connected" and the variations thereof is intended to encompass both wireless electrical connections and electrical connections made via one or more wires, cables, or conductors (wired connections). Other terms are to be construed using their broadest reasonable meaning unless they are used in a context that requires a different interpretation.

The invention claimed is:

1. An antenna unit for use in an antenna array, comprising: a circuit for generating a negative group delay (NGD) that includes an antenna configured to both radiate an electrical signal delivered thereto and generate an NGD, and further wherein the antenna is configured to generate the NGD in the absence of a lossy resonator;
an input;
an output; and
a power divider,
wherein the power divider is electrically connected in circuit between the input, the antenna of the NGD circuit, and the output.

2. The antenna unit of claim 1, wherein the antenna has an input impedance sufficient for the antenna to exhibit a resonance behavior required to generate the NGD.

3. The antenna unit of claim 1 further comprising a transmission line for electrically connecting the antenna unit to an adjacent antenna unit of the antenna array, wherein the NGD circuit is connected in shunt with the transmission line.

4. The antenna unit of claim 3, wherein the antenna of the NGD circuit has an input impedance sufficient to generate the NGD of a suitable value to cancel out at least a portion of a positive group delay generated in the transmission line.

5. The antenna unit of claim 1, wherein an input impedance of the antenna is used to generate the NGD.

6. The antenna unit of claim 1 further comprising a transmission line for electrically connecting the antenna unit to an adjacent antenna unit of the antenna array.

7. The antenna unit of claim 6, wherein the antenna of the NGD circuit has an input impedance sufficient to generate the NGD of a suitable value to cancel out at least a portion of a positive group delay generated in the transmission line.

8. The antenna unit of claim 1 wherein the power divider comprises a T-junction power divider.

9. An antenna unit for use in an antenna array, comprising: a circuit for generating a negative group delay (NGD) that includes an antenna configured to both radiate an electrical signal delivered thereto and generate an NGD, and further wherein the antenna is configured to generate the NGD in the absence of a lossy resonator;
an input;
an output;
a power divider; and
an amplifier,
wherein the power divider is electrically connected in circuit between the input and the antenna of the NGD circuit, and the amplifier of the antenna unit is electrically connected in circuit between the power divider and the output.

10. The antenna unit of claim 9, wherein the amplifier has a gain that is equivalent to a power dividing ratio of the power divider.

11. The antenna unit of claim 9, wherein an input impedance of the antenna is used to generate the NGD.

12. The antenna unit of claim 9 wherein the power divider comprises a T-junction power divider.

13. The antenna unit of claim 9 further comprising a transmission line for electrically connecting the antenna unit to an adjacent antenna unit of the antenna array.

14. The antenna unit of claim 13, wherein the antenna of the NGD circuit has an input impedance sufficient to generate the NGD of a suitable value to cancel out at least a portion of a positive group delay generated in the transmission line.

15. The antenna unit of claim 13 wherein the NGD circuit is connected in shunt with the transmission line.

16. A circuit for generating a negative group delay (NGD), comprising:
an amplifier, wherein the amplifier is configured to both amplify an electrical signal received thereby and generate an NGD, and further wherein the amplifier is configured to generate the NGD in the absence of a lossy resonator.

17. The circuit of claim 16, wherein the amplifier has an input impedance sufficient for the amplifier to exhibit a resonance behavior required to generate the NGD.

18. The circuit of claim 16 further comprising a first matching circuit electrically connected to an input of the amplifier and a second matching circuit electrically connected to an output of the amplifier, wherein the amplifier has an input impedance and at least one of the first and second matching circuits has a quality factor sufficient for the combination of the amplifier and the at least one of the first and second matching circuits to exhibit a resonance behavior required to generate the NGD.

19. An antenna unit for use in an antenna array, comprising the NGD circuit of claim 16.

20. The antenna unit of claim 19 further including a transmission line for electrically connecting the antenna unit to an adjacent antenna unit of the antenna array, wherein
the NGD circuit is connected in shunt or in series with the transmission line.

21. The antenna unit of claim 20, wherein the NGD circuit has an input impedance sufficient to generate the NGD of a suitable value to cancel out at least a portion of a positive group delay generated in the transmission line.

22. The antenna unit of claim 19, further comprising:
an input;
an output;
a power divider; and
an antenna,
wherein the power divider is electrically connected in circuit between the input, the output, and the amplifier of the NGD circuit, and
the amplifier is electrically connected in circuit between the power divider and the antenna.

23. The antenna unit of claim 22, wherein the amplifier of the NGD circuit has a gain that is equivalent to a power dividing ratio of the power divider.

24. The circuit of claim 16, further comprising a resonance circuit electrically connected in circuit with the amplifier, wherein the combination of the amplifier and the resonance circuit is configured to amplify an electrical signal received thereby and to generate the NGD.

25. The circuit of claim 24, wherein the resonance circuit comprises a parallel resonance circuit.

26. The circuit of claim 25, wherein the resonance circuit is electrically connected in parallel with the amplifier.

27. The circuit of claim 24, wherein the amplifier has an input impedance and the resonance circuit has a quality factor sufficient for the combination of the amplifier and resonance circuit to exhibit a resonance behavior required to generate the NGD.

28. The circuit of claim 24, wherein the combination of the amplifier and the resonance circuit is configured to generate the NGD in the absence of a lossy resonator.

29. An antenna unit for use in an antenna array, comprising the NGD circuit of claim 24.

30. The antenna unit of claim 29 further including a transmission line for electrically connecting the antenna unit to an adjacent antenna unit of the antenna array, wherein
the NGD circuit is connected in series with the transmission line.

31. The antenna unit of claim 30, wherein the amplifier has an input impedance and the resonance circuit has a quality factor sufficient for the combination of the amplifier and resonance circuit to generate the NGD of a suitable value to cancel out at least a portion of a positive group delay generated in the transmission line.

* * * * *